United States Patent
Cho et al.

(10) Patent No.: US 6,795,354 B2
(45) Date of Patent: Sep. 21, 2004

(54) CIRCUIT FOR CONTROLLING AN AC-TIMING PARAMETER OF A SEMICONDUCTOR MEMORY DEVICE AND METHOD THEREOF

(75) Inventors: Jeong-Hyeon Cho, Seoul (KR); Byung-Chul Kim, Kyungki-do (KR)

(73) Assignee: Samsung Electronic Co., Ltd., Suwon (KR)

( * ) Notice: Subject to any disclaimer, the term of this patent is extended or adjusted under 35 U.S.C. 154(b) by 0 days.

(21) Appl. No.: 10/321,242

(22) Filed: Dec. 16, 2002

(65) Prior Publication Data

US 2003/0111676 A1 Jun. 19, 2003

(30) Foreign Application Priority Data

Dec. 19, 2001 (KR) .................................. 10-2001-81254

(51) Int. Cl.[7] .......................................... G11C 11/063
(52) U.S. Cl. ...................................... 365/199; 365/194
(58) Field of Search ................................ 365/199, 194, 365/233, 189.07

(56) References Cited

U.S. PATENT DOCUMENTS

| | | | | |
|---|---|---|---|---|
| 5,883,534 A | * | 3/1999 | Kondoh et al. | ............. 327/156 |
| 6,163,196 A | * | 12/2000 | Martinez et al. | ............ 327/270 |
| 6,324,142 B1 | * | 11/2001 | Ishitoya et al. | .......... 369/59.23 |

* cited by examiner

Primary Examiner—Thong Le
(74) Attorney, Agent, or Firm—Marger Johnson & McCollom. P.C.

(57) ABSTRACT

A circuit for controlling an AC-timing parameter of a semiconductor memory device and method thereof are provided. The AC-timing parameter control circuit includes a delay-time-defining portion, a comparing portion, and a controlling portion. The control circuit compares the pulse width or period of an input signal to one or more different reference-widths pulses, with the reference width(s) set by the delay-time-defining portion and the reference pulses generated by the comparing portion. The controlling portion indicates whether the input signal width or period was less than or greater than each o the reference-width pulses. The control circuit output signals can be used to tailor the operation of the device based on a direct comparison of an AC-timing parameter to one or more reference values.

48 Claims, 10 Drawing Sheets

CIRCUIT FOR CONTROLLING AN AC-TIMING PARAMETER OF A SEMICONDUCTOR MEMORY DEVICE AND METHOD THEREOF

This application claims priority from Korean Patent Application No. 2001-81254, filed on Dec. 19, 2001, the contents of which are incorporated herein by this reference in their entirety.

BACKGROUND OF THE INVENTION

1. Field of the Invention

The present invention relates to a semiconductor memory device, and more particularly, to a circuit for controlling an AC-timing parameter of a semiconductor memory device by recognizing a variation in the AC-timing parameter and controlling the operation of the semiconductor memory device.

2. Description of the Related Art

Semiconductor memory device operation-timing (also referred to as AC-timing) parameters define a specific operating time or a time interval between specific operations, and the permitted limit of the operation timing is stipulated so as to guarantee the normal operation of a semiconductor memory device.

In general, the specified value for a semiconductor memory device AC-timing parameter is defined as a multiple of a predetermined reference time or a cycling time of a reference clock signal. The broader the permitted limit of the value of the specification of the AC-timing parameter, the greater guarantee for a better quality semiconductor memory device. As the permitted limit of the specified value for the AC-timing parameter is increased, however, circuit design becomes more difficult as it is difficult to obtain the same operational characteristics within the permitted limit.

In a conventional semiconductor memory device, the problem is resolved by mounting a selective fuse or a selective metal, or by applying a specific mode register set (MRS) when designing circuitry. In the case of mounting a selective metal, a separate mask is required, and thus the manufacturing cost of the mask increases. In the case of mounting a selective fuse, a space for mounting the fuse must be obtained, and thus the chip size increases. Also, a fuse cutting procedure must be included seperately, and thus manufacturing cost and time increase.

When applying a MRS, a circuit for applying a MRS must be included, and thus the chip size increases. A separate procedure such as fuse cutting is unnecessary, however, and even a finished product can be modified.

Where the AC-timing parameter is varied and there is a need to reflect the variation when applying a MRS, however, a procedure for programming a MRS must be separately performed. Thus, it is difficult to maintain the same semiconductor memory device operational characteristics and the performance of the semiconductor memory device is lowered.

SUMMARY OF THE INVENTION

It is a first object of the present invention to provide a circuit for controlling a semiconductor memory device AC-timing parameter by recognizing a variation in the AC-timing parameter and controlling the operation of the semiconductor memory device.

It is a second object of the present invention to provide a method for controlling a semiconductor memory device AC-timing parameter by recognizing a variation in the AC-timing parameter and controlling the operation of the semiconductor memory device.

It is a third object of the present invention to provide a circuit for recognizing a cycle of a semiconductor memory device reference clock signal and controlling the operation of the semiconductor memory device.

Accordingly, to achieve the first object, there is provided a circuit for controlling a semiconductor memory device AC-timing parameter. The circuit includes a delay-time-defining portion, a comparing portion, and a controlling portion.

The delay-time-defining portion receives consecutive input signals and generates first through n-th (n is a natural number) delay signals in which the input signals are delayed by corresponding predetermined delay times.

The comparing portion receives the input signals and the first through n-th delay signals and generates first through n-th comparison pulse signals, each having an active section for a corresponding predetermined duration.

The controlling portion receives the input signals and the first through n-th comparison pulse signals, compares the input signals with the first through n-th comparison pulse signals, and generates first through n-th operation control signals for controlling a semiconductor memory device AC timing parameter.

Here, the input signals are semiconductor memory device clock signals or commands.

It is preferable that the delay-time-defining portion includes a first delay device for generating the first delay signal by receiving the input signals and by delaying the input signals by a predetermined delay time, a second delay device for generating the second delay signal by receiving the first delay signal and by delaying the first delay signal by a predetermined delay time, and an n-th delay device for generating the n-th delay signal by receiving an (n−1)-th delay signal and by delaying the (n−1)-th delay signal by a predetermined delay time.

It is also preferable that the comparing portion include first through n-th comparing means, which receive the input signals and the corresponding first through n-th delay signals, respectively, and generate the first through n-th comparison pulse signals, each having an active section for a predetermined duration.

It is also preferable that the controlling portion includes first through n-th operation-controlling parts, which receive the input signals and the corresponding first through n-th comparison pulse signals, respectively, compare times of active sections of the input signals with times of active sections of the corresponding first through n-th comparison pulse signals, and generate first through n-th operation control signals.

It is also preferable that the circuit further includes an operation-determining portion, which receives the input signals and an operation-enabling signal, and determines whether or not operation input signals are transferred to the delay-time-defining portion.

To achieve the second object, there is provided a method for controlling a semiconductor memory device AC timing parameter by recognizing a variation in the AC timing parameter and controlling the operation of the semiconductor memory device. The method includes: (a) receiving consecutive input signals and generating first through n-th (n is a natural number) delay signals in which the input signals are delayed by corresponding predetermined delay times; (b)

receiving the input signals and the first through n-th delay signals and generating first through n-th comparison pulse signals, each having an active section for a predetermined duration; and (c) receiving the input signals and the first through n-th comparison pulse signals, comparing the input signals with the first through n-th comparison pulse signals and generating first through n-th operation control signals for controlling an AC-timing parameter of the semiconductor memory device. Here, the input signals are semiconductor memory device clock signals or commands.

It is preferable that step (a) includes: (a1) generating the first delay signal by receiving the input signals and by delaying the input signals by a predetermined delay time; (a2) generating the second delay signal by receiving the first delay signal and delaying the first delay signal by a predetermined delay time; and (a3) generating the n-th delay signal by receiving an (n−1)-th delay signal and by delaying the (n−1)-th delay signal by a predetermined delay time.

To achieve the third object, there is provided a circuit for recognizing a cycle of a reference clock signal. The circuit includes an operation-determining portion, a delay-time-defining portion, a comparing portion, and a controlling portion.

The operation-determining portion receives consecutive input signals and an operation-enabling signal and generates an operation-determining signal for controlling the operation of the controlling portion.

The delay-time-defining portion receives the input signals and generates first and second delay signals, in which the input signals are delayed by corresponding predetermined delay times.

The comparing portion receives the first and second delay signals and generates first and second comparison pulse signals, each having an active section for a predetermined duration.

The controlling portion, which receives the operation-determining signal and the first and second comparison pulse signals, compares the operation-determining signal with the first and second comparison pulse signals, and generates first and second operation control signals for controlling the semiconductor memory device.

It is preferable that the delay-time-defining portion include an odd number of delay devices, which have predetermined delay times and are connected in series.

It is also preferable that the comparing portion include a first comparing means, which receives the input signals and the corresponding first delay signal and generates the first comparison pulse signal having an active section for a predetermined duration, and a second comparing means, which receives the input signals and the corresponding second delay signal and generates the second comparison pulse signal having an active section for a predetermined duration.

It is also preferable that the controlling portion includes a first operation-controlling part, which receives the operation-determining signal and the corresponding first comparison pulse signal, compares the duration of an active section of the operation-determining signal with the duration of an active section of the first comparison pulse signal, and generates the first operation control signal for controlling the semiconductor memory device, and a second operation-controlling part, which receives the operation-determining signal and the corresponding second comparison pulse signal, compares the duration of an active section of the operation-determining signal with the duration of an active section of the second comparison pulse signal and generates the second operation control signal for controlling the semiconductor memory device.

Accordingly, the circuit for controlling an AC-timing parameter of a semiconductor memory device and method thereof according to the present invention can recognize a variation in the AC-timing parameter and can control the operation of the semiconductor memory device suitable for the AC-timing parameter.

BRIEF DESCRIPTION OF THE DRAWINGS

The above objects and advantages of the present invention will become more apparent by detailed descriptions of the preferred embodiments thereof with reference to the attached drawings, wherein.

DETAILED DESCRIPTION OF THE INVENTION

Figure 1:
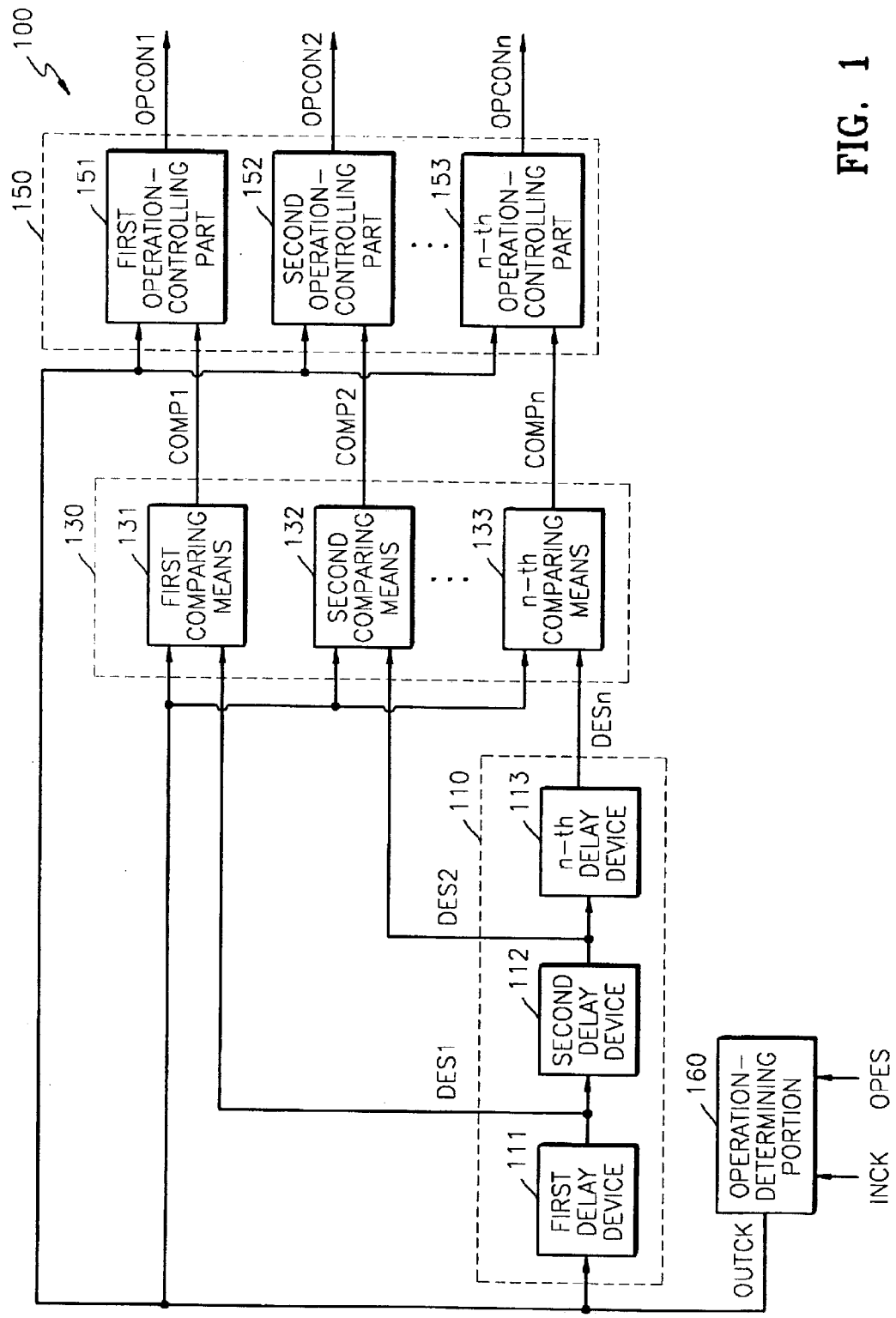
FIG. 1 is a block diagram of a semiconductor memory device AC-timing parameter control circuit, according to a first embodiment of the present invention.

The present invention is described herein with reference to the accompanying drawings in which preferred embodiments of the invention are shown. Like reference numerals refer to like elements throughout the drawings.

FIG. 1 is a block diagram of AC-timing-parameter control circuit according to a first embodiment of the present invention. Referring to FIG. 1, an AC-timing-parameter includes a delay-time-defining portion 110, a comparing portion 130, and a controlling portion 150.

The delay-time-defining portion 110 receives an input signal INCK (through optional operation—determining portion 160 in FIG. 1), generates first through n-th (n is a natural number) delay signals DES1, DES2, ..., DESn in which the input signals INCK are delayed by corresponding a predetermined delay times.

The input signal INCK is a semiconductor memory device clock signal or command. More specifically, the delay-time-defining portion 110 includes several delay devices in series: a first delay device 111 in which the input signal INCK is received and delayed by a predetermined delay time; a second delay device 112 in which the first delay signal DES1 is received and delayed by a predetermined delay time; and a "last" or n-th delay device 113 in which an (n−1)-th delay signal (not shown) is received and delayed by a predetermined delay time.

In this embodiment, the first, second, and n-th delay devices 111, 112, and 113 have different delay times. The first, second, and n-th delay devices 111, 112, and 113 may, however, have the same delay time depending on the circuit configuration.

The comparing portion 130 receives the input signal INCK and the first through n-th delay signals DES1, DES2, ..., DESn, and generates first through n-th comparison pulse signals COMP1, COMP2, ..., COMPn, each having an active section for a predetermined duration.

More specifically, the comparing portion 130 includes first through n-th comparing means 131, 132, and 133. Each will receive the input signal INCK, respectively receive the corresponding first through n-th delay signals DES1, DES2, ..., DESn, and respectively generate the first through n-th comparison pulse signals COMP1, COMP2, ..., COMPn, each having an active section for a predetermined duration. The first through n-th comparison pulse signals COMP1, COMP2, ..., COMPn have active sections with different durations.

The controlling portion 150 receives the input signal INCK and the first through n-th comparison pulse signals COMP1, COMP2, ..., COMPn, compares the input signal INCK with the first through n-th comparison pulse signals COMP1, COMP2, ..., COMPn, and generates first through n-th operation control signals OPCON1, OPCON2, ..., OPCONn for controlling an AC-timing parameter.

More specifically, the controlling portion 150 includes first through n-th operation-controlling parts 151, 152, and 153. Each will receive the input signal INCK, respectively receive the corresponding first through n-th comparison pulse signals COMP1, COMP2, ..., COMPn, compare the duration of the active section of each of the input signals INCK with the duration of the active section of the corresponding first through n-th comparison pulse signals COMP1, COMP2, ..., COMPn, and generate first through n-th operation control signals OPCON1, OPCON2, ..., OPCONn for controlling an AC-timing parameter.

Here, the first through n-th operation control signals OPCON1, OPCON2, ..., OPCONn represent whether the active section of the input signal INCK is longer or shorter than that of the corresponding first through n-th comparison pulse signals COMP1, COMP2, ..., COMPn, depending on the logic level of the corresponding first through n-th operation control signals OPCON1, OPCON2, ..., OPCONn.

The AC-timing-parameter control circuit 100 may further include an operation-determining portion 160, which receives the input signal INCK and an operation-enabling signal OPES. The state of operation-enabling signal OPES determines whether operation-input signal OUTCK is transferred to the delay time defining portion 110 or not. Thus, circuit 100 is enabled when OPES is asserted and disabled otherwise.

Here, the operation-enabling signal OPES is generated by a mode register set (MRS), but OPES also may be generated by an external command or an internal signal other than a MRS. The operation-determining portion 160 may be a NAND gate.

Hereinafter, the operation of the AC-timing-parameter control circuit will be described in detail with reference to FIG. 1.

The delay-time-defining portion 110 receives the predetermined input signal INCK and generates first through n-th delay signals DES1, DES2, ..., DESn in which the input signal INCK is delayed by corresponding predetermined delay times.

The input signal INCK may be a clock signal or command signal of a semiconductor memory device. For example, if control circuit 100 recognizes the cycle of the memory device reference clock signal, and thereby controls the specific operation of the semiconductor memory device, the reference clock signal may be used for the input signal INCK. If control circuit 100 recognizes a row address strobe (RAS) time (usually marked tRAS), and thereby controls the specific operation of the semiconductor memory device, a row active (RA) signal may be used for the input signal INCK. Here, the RAS time is the time required from when the RA signal is enabled to when a row precharge (RP) signal is enabled.

The delay-time-defining portion 110 includes first through n-th delay devices 111, 112, and 113. The first delay device 111 generates the first delay signal DES1 by receiving the input signal INCK and delaying the input signal INCK by a predetermined delay time. The first delay signal DES1 is applied to the first comparing means 131 of the comparing portion 130 (to be described later), and to the second delay device 112. The second delay device 112 generates the second delay signal DES2 by receiving the first delay signal DES1 and delaying the first delay signal DES1 by a predetermined delay time. The second delay signal DES2 is applied to the second comparing means 132 of the comparing portion 130 and to a second delay device (not shown). Similarly, the n-th delay device 113 generates the n-th delay signal DESn in which an (n−1)-th delay signal (not shown) is received and delayed by a predetermined delay time. The first through n-th delay devices 111, 112, and 113 may be comprised of logic devices, such as a buffer, for delaying signals. In this embodiment, the first through n-th delay devices 111, 112, and 113 have different delay times but may be embodied to have the same delay time.

Since the first delay signal DES1 is generated by delaying the input signal INCK only by the first delay device DES1, the first delay signal DES1 is different from the second delay signal DES2, which is generated by delaying the input signal INCK by the first and second delay devices 111 and 112. That is, the degree of the delays of the first through n-th delay signal for each DES1, DES2, ..., DESn is different.

The comparing portion 130 receives the input signal INCK and the first through n-th comparison pulse signals COMP1, COMP2, ..., COMPn and generates the first through n-th comparison pulse signals COMP1, COMP2, ..., COMPn, each having an active section for a predetermined duration.

The comparing portion 130 includes the first through n-th comparing means 131, 132, and 133. The first comparing means 131 receives the input signal INCK and the corresponding first delay signal DES1 and generates the first comparison pulse signal COMP1 having an active section for a predetermined duration. The second comparing means 132 receives the input signal INCK and the corresponding second delay signal DES2 and generates the second comparison pulse signal COMP2 having an active section for a predetermined duration. Similarly, the n-th comparing means 133 receives the input signal INCK and the corresponding n-th delay signal DESn and generates the n-th comparison pulse signal COMPn having an active section for a predetermined duration. The degree of the delay for each of the first through n-th delay signals DES1, DES2, ..., DESn is different, and thus active sections of the first through n-th comparison pulse signals COMP1, COMP2, ..., COMPn have different durations.

The controlling portion 150 receives the input signal INCK and the first through n-th comparison pulse signals COMP1, COMP2, ..., COMPn, compares the input signal INCK with the first through n-th comparison pulse signals COMP1, COMP2, ..., COMPn, and generates first through n-th operation control signals OPCON1, OPCON2, ..., OPCONn for controlling an AC-timing parameter.

The controlling portion 150 includes first through n-th operation-controlling parts 151, 152, and 153. The first operation-controlling part 151 receives the input signal INCK pulses and the corresponding first comparison pulse signal COMP1, compares the duration of an active section of each of the input signal INCK pulses with the duration of an active section of the corresponding first comparison pulse signal COMP1, and generates the first operation control signal OPCON1 for controlling an AC-timing parameter. The second operation controlling part 152 receives the input signal INCK pulses and the corresponding second comparison pulse signal COMP2, compares the duration of an active section of each of the input signal INCK pulses with the duration of an active section of the corresponding second comparison pulse signal COMP2, and generates the second operation control signal OPCON2 for controlling the AC-timing parameter. Similarly, the n-th operation-controlling part 153 receives the input signal INCK pulses and the corresponding n-th comparison pulse signal COMPn, compares the duration of an active section of each of the input signal INCK pulses with the duration of an active section of the corresponding n-th comparison pulse signal COMPn, and generates the n-th operation control signal OPCONn for controlling the AC-timing parameter.

Here, the first through n-th operation control signals OPCON1, OPCON2, ..., OPCONn represent whether the active section of each of the input signal INCK pulses is longer or shorter than that of the corresponding first through n-th comparison pulse signals COMP1, COMP2, ..., COMPn, depending on the logic level of the corresponding first through n-th operation control signals OPCON1, OPCON2, ..., OPCONn. That is, the first through n-th operation-controlling parts 151, 152, and 153 compare the first through n-th comparison pulse signals COMP1, COMP2, ..., COMPn, respectively, with the beginning of the next period of input signal INCK.

Since the delay times of the first through n-th delay devices 111, 112, and 113 are known, the durations of sections in which the first through n-th comparison pulse signals COMP1, COMP2, ..., COMPn are enabled can be known. Thus, it can be known whether the active section of each of the input signal INCK pulses is longer or shorter than that of the corresponding first through n-th comparison pulse signals COMP1, COMP2, ..., COMPn, depending on whether the corresponding first through n-th operation control signals OPCON1, OPCON2, ..., OPCONn are output at a high level or a low level.

Thus, by using the first through n-th operation control signals OPCON1, OPCON2, ..., OPCONn, if it is determined that the active sections of the input signal INCK pulses are longer than the time required for a predetermined operation of a semiconductor memory device, the semiconductor memory device performs a first operation, and if it is determined that the active sections of the input signals INCK are shorter than the time required for a predetermined operation of the semiconductor memory device, a circuit for performing a second operation is mounted in the semiconductor memory device, thereby controlling the operation of the semiconductor memory device.

Control circuit 100 may further include an operation-determining portion 160, which receives the input signal INCK and the operation-enabling signal OPES. OPES determines whether or not the operation input signal OUTCK is transferred to the delay time defining portion 110. That is, in a case where there is no need to use control circuit 100 to control an AC-timing parameter, the operation-enabling signal OPES is applied to the operation-determining portion 160 such that the input signal INCK are not applied to the delay-time-defining portion 110, and control circuit 100 does not operate. The operation-determining portion 160 may also control the comparing portion 130 or the controlling portion 150 to control operation of control circuit 100 control.

Here, the operation-enabling signal OPES may be generated by a MRS. That is, if the semiconductor memory device meets predetermined conditions by adjusting the MRS, the operation-enabling signal OPES is generated so as to disable control circuit 100. The operation enabling signal OPES may also be generated by an external command or an internal signal other than the MRS.

Figure 2:
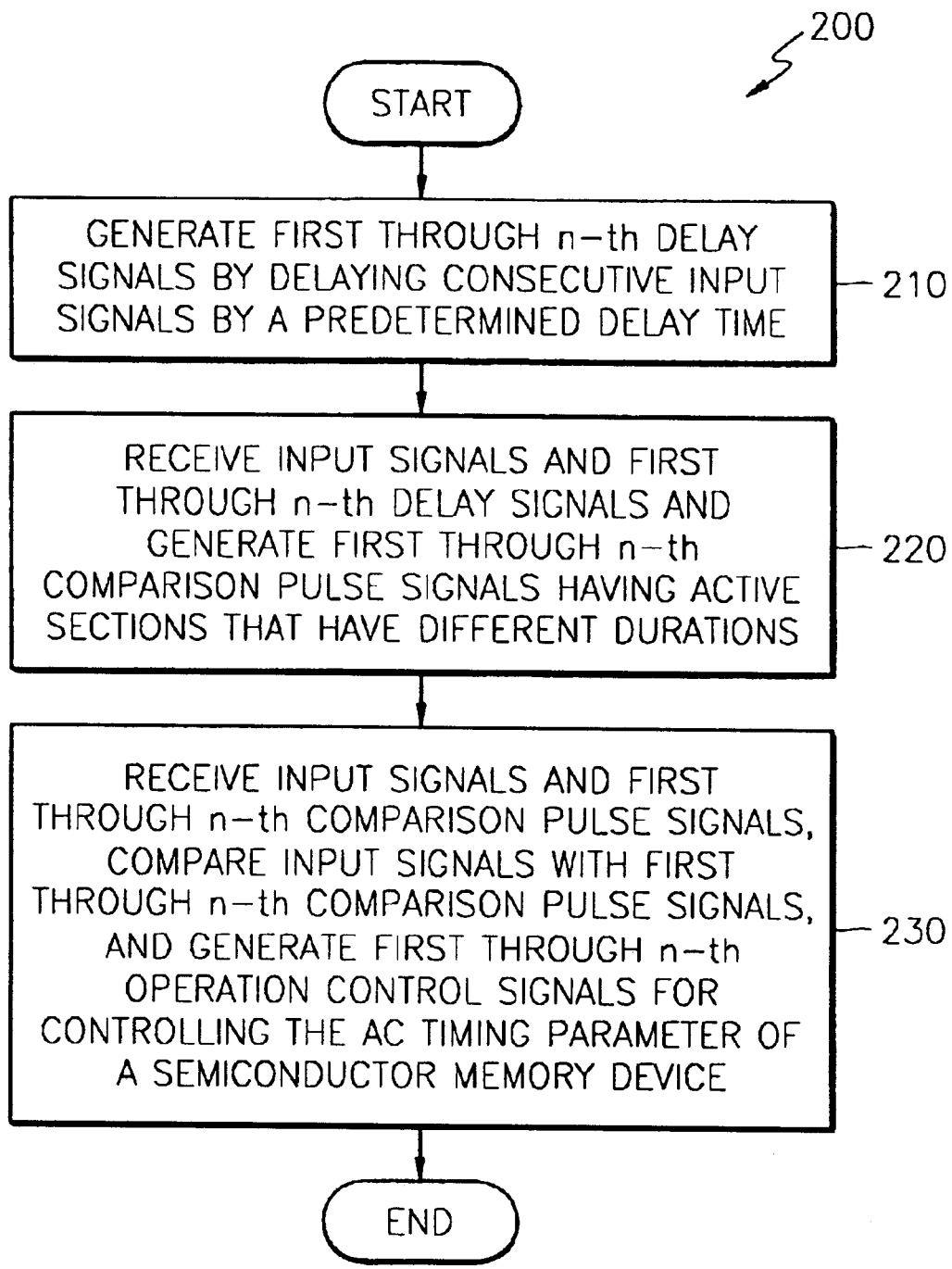
FIG. 2 is a flow chart illustrating a method for controlling a semiconductor memory device AC timing parameter according to the first embodiment of the present invention.

FIG. 2 is a flow chart illustrating a method for controlling an AC timing parameter of a semiconductor memory device according to the first embodiment of the present invention. This method is described with reference to FIGS. 1 and 2.

In the method, which is capable of recognizing an AC-timing parameter and controlling the operation of a semiconductor memory device, in step 210, the first through n-th (n is a natural number) delay signals DES1, DES2, ..., DESn are generated by delaying input signal INCK pulses by a predetermined delay time. More specifically, in step 210, an input signal INCK is received and delayed by a predetermined delay time, thereby generating the first delay signal DES1. The first delay signal DES1 is used to generate the second delay signal DES2 and a first comparison pulse signal COMP1 to be described later. The first delay signal DES1 is received and delayed by a predetermined delay time, thereby generating the second delay signal DES2. In this way, an (n−1)-th delay signal DESn−1 is received and delayed by a predetermined delay time, thereby generating the n-th delay signal DESn.

Here, the predetermined delay times for delaying the input signal INCK are different. Thus, the first through n-th delay signals DES1, DES2, ..., DESn have different delay times. Times for delaying the input signals may, however, be equalized depending on a method for forming a circuit that operates according to the method (200) for controlling an AC-timing parameter of a semiconductor memory device.

The input signal INCK may be a semiconductor memory device clock signal or command signal. For example, if the method (200) for controlling an AC-timing parameter recognizes the cycle of the semiconductor memory device reference clock signal, and thereby controls the specific operation of the semiconductor memory device, the reference clock signal may be used for the input signals INCK. If the method (200) recognizes a row address strobe (RAS)

time (usually marked tRAS), and thereby controls the specific operation of the semiconductor memory device, a row active (RA) signal may be used for the input signals INCK. Here, the RAS time is the time required from when the RA signal is enabled to when a row precharge (RP) signal is enabled.

In addition, an operation-enabling signal OPES can determine whether or not the input signal is applied. Thus, in a case where there is no need to use the method (200) for controlling an AC-timing parameter of a semiconductor memory device, the operationenabling signal OPES is generated such that the input signal is not applied to control circuit 100, and control circuit 100 does not operate. The operation-enabling signal may be generated by a MRS. That is, if the semiconductor memory device meets predetermined conditions by adjusting the MRS, the operation-enabling signal is generated so as to not use the method (200) for controlling an AC-timing parameter. The operation-enabling signal may also be generated by an external command or an internal signal other than the MRS.

In step 220, the input signal INCK and the first through n-th delay signals DES1, DES2, ..., DESn are received, and the first through n-th comparison pulse signals COMP1, COMP2, ..., COMPn, each having an active section for a predetermined duration, are generated. More specifically, in step 220, the input signal and the corresponding first delay signal DES1 are received and used to generate the first comparison pulse signal COMP1 having an active section with predetermined duration. In the same way, the second through n-th comparison pulse signals COMP2, ..., COMPn, are generated. The input signal is compared with the first through n-th delay signals DES1, DES2, ..., DESn, which are generated by delaying the input signal INCK, and the first through n-th comparison pulse signals COMP1, COMP2, ..., COMPn, are generated, each having a pulse shape. In addition, the degree of the delay for the first through n-th delay signals DES1, DES2, ..., DESn is different, and thus active sections of the first through n-th comparison pulse signals COMP1, COMP2, ..., COMPn, have different durations.

In step 230, the input signal INCK pulses and the first through n-th comparison pulse signals COMP1, COMP2, ..., COMPn are received, the input signal INCK pulses are compared with the first through n-th comparison pulse signals COMP1, COMP2, ..., COMPn, and the first through n-th operation control signals OPCON1, OPCON2, ..., OPCONn, for controlling an AC-timing parameter of the semiconductor memory device, are generated. More specifically, in step 230, an input signal INCK and the corresponding first comparison pulse signal COMP1 are received, the duration of the active section of the input signal INCK pulse is compared with the duration of an active section of the corresponding first comparison pulse signal COMP1, and the first operation control signal OPCON1 for controlling an AC timing parameter of the semiconductor memory device is generated. In the same way, the second through n-th operation control signals OPCON1, OPCON2, ..., OPCONn are generated.

The first through n-th operation control signals OPCON1, OPCON2, ..., OPCONn represent whether the active sections of the input signal INCK pulse are longer or shorter than those of the first through n-th comparison pulse signals COMP1, COMP2, ..., COMPn, depending on the logic levels of the first through n-th operation control signals OPCON1, OPCON2, ..., OPCONn. Since a user knows the delay times of the first through n-th delay signals OPCON1, OPCON2, ..., OPCONn, it can be known how long the first through n-th comparison pulse signals COMP1, COMP2, ..., COMPn are enabled. Thus, it can be known whether the active sections of the input signal INCK pulses are longer or shorter than those of the first through n-th comparison pulse signals COMP1, COMP2, ..., COMPn, depending on whether the first through n-th operation control signals OPCON1, OPCON2, ..., OPCONn are output at a high level or a low level. That is, by using the first through n-th operation control signals OPCON1, OPCON2, ..., OPCONn, if it is determined that the active sections of the input signal INCK pulses are longer than the time required for a predetermined operation of a semiconductor memory device, the semiconductor memory device performs a first operation, and if it is determined that the active sections of the input signal INCK pulses are shorter than the time required for a predetermined operation of the semiconductor memory device, the semiconductor memory device performs a second operation. Thus, the operation of the semiconductor memory device can be altered for different input signal timing patterns.

Figure 3:
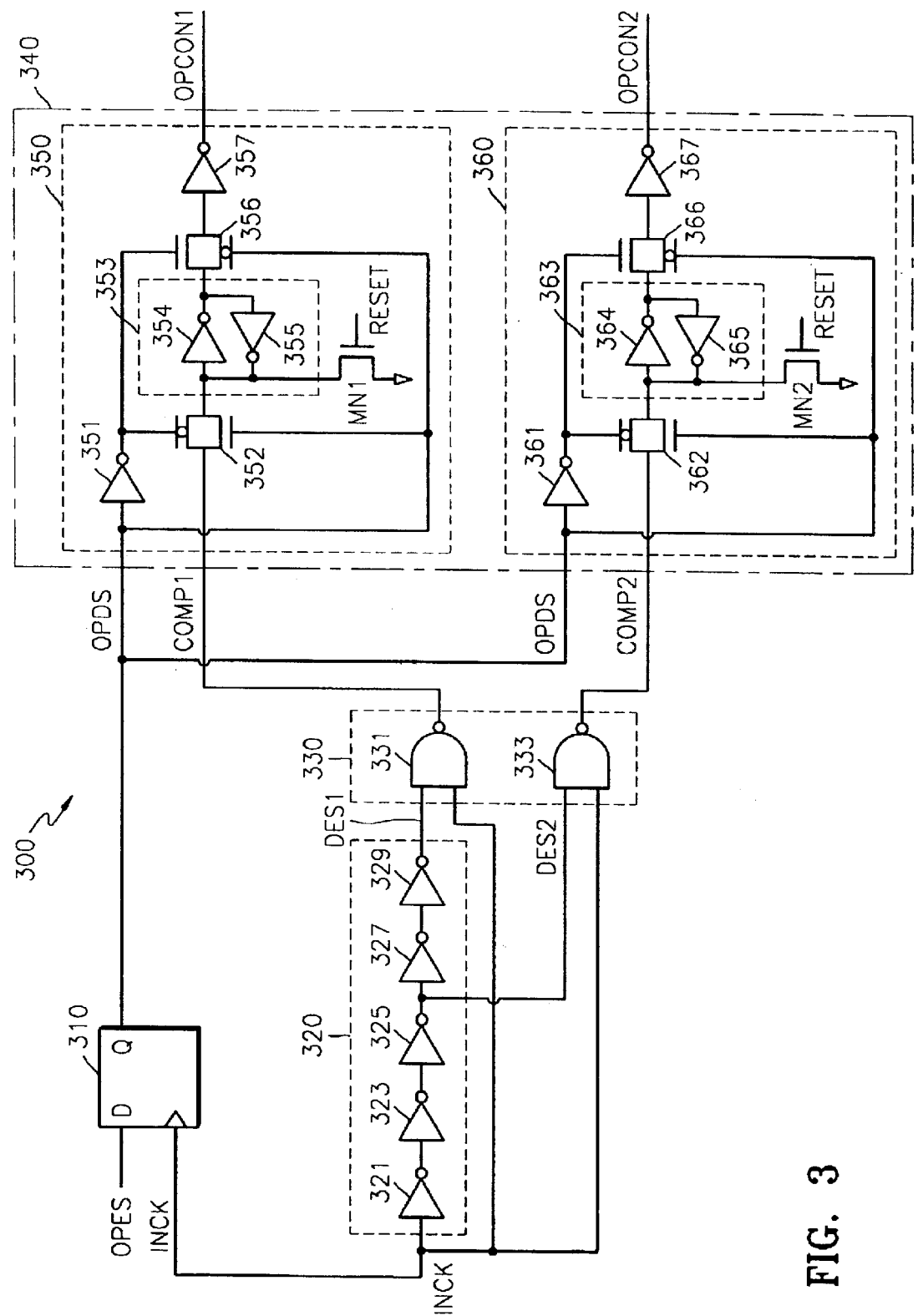
FIG. 3 is a circuit diagram of a circuit for recognizing a cycle of a reference clock signal according to the first embodiment of the present invention.

FIG. 3 is a circuit diagram of a circuit for recognizing a cycle of a reference clock signal according to the first embodiment of the present invention. Referring to FIG. 3, circuit 300 includes an operation-determining portion 310, a delay-time-defining portion 320, a comparing portion 330, and a controlling portion 340.

The operation-determining portion 310 receives consecutive input signal INCK pulses and an operation-enabling-signal OPES, and generates an operation-determining signal OPDS for controlling the operation of the controlling portion 340. Here, the input signal INCK is a reference clock signal, i.e., an externally input clock signal used to operate the semiconductor memory device. The operation-determining portion 310 is a flip-flop. Flip-flop 310 receives the operation enabling signal OPES at an input terminal D, receives the input signal INCK at a clock input terminal, and outputs the operation-determining signal OPDS at an output terminal Q.

The delay-time-defining portion 320 receives input signal INCK and generates first and second delay signals DES1 and DES2 in which the input signal INCK is delayed by a predetermined delay time. The delay-time-defining portion 320 includes an odd number of delay devices (321, 323, 325, 327, and 329 are shown), which have predetermined delay times and are connected in series. More specifically, in this embodiment the delay devices 321, 323, 325, 327, and 329 have different delay times but may be embodied to have the same delay time.

The output of the third delay device 325 becomes second delay signal DES2. The output of the fifth delay device 329 becomes first delay signal DES1.

The comparing portion 330 receives the first and second delay signals DES1 and DES2, and generates first and second comparison pulse signals COMP1 and COMP2, each having an active section for a predetermined duration. More specifically, the comparing portion 330 includes: a first comparing means 331, which receives the input signal INCK and the corresponding first delay signal DES1, and generates the first comparison pulse signal COMP1 having an active section with a predetermined duration; and a second comparing means 333, which receives the input signal INCK and the corresponding second delay signal DES2, and generates the second comparison pulse signal COMP2 having an active section with a predetermined duration. The first and second comparing means 331 and 333 may be NAND gates. The delay times of the first and second delay signals DES1 and DES2 are different, and thus the first and second comparison pulse signals COMP1 and COMP2 have active sections with different durations.

The controlling portion 340 receives the operation-determining signal OPDS and the first and second comparison pulse signals COMP1 and COMP2, compares the operation-determining signal OPDS with the first and second comparison pulse signals COMP1 and COMP2, and generates first and second operation control signals OPCON1 and OPCON2 for controlling a semiconductor memory device. More specifically, the controlling portion 340 includes a first operation-controlling part 350, which receives the operation-determining signal OPDS and the corresponding first comparison pulse signal COMP1, compares the duration of an active section of the operation-determining signal OPDS with the duration of an active section of the first comparison pulse signal COMP1, and generates the first operation control signal OPCON1 for controlling the semiconductor memory device, and a second operation-controlling part 360, which receives the operation-determining signal OPDS and the corresponding second comparison pulse signal COMP2, compares the duration of an active section of the operation-determining signal OPDS with the duration of an active section of the second comparison pulse signal COMP2, and generates the second operation control signal OPCON2 for controlling the semiconductor memory device.

The first and second operation control signals OPCON1 and OPCON2 represent whether the active section of the operation-determining signal OPDS is longer or shorter than that of the corresponding first or second comparison pulse signal COMP1 or COMP2, depending on the logic level of the corresponding first or second operation control signal OPCON1 or OPCON2.

More specifically, the first operation-controlling part 350 includes: a first inverter 351, which receives and inverts the operation-determining signal OPDS; a first transmission gate 352, which transmits the first comparison pulse signal COMP1 to a first latching unit 353 in response to the operation-determining signal OPDS and the first inverter 351 output; the first latching unit 353, which includes a second inverter 354 for inverting the output of the first transmission gate 352 and a third inverter 355 for inverting the output of the second inverter 354 and applying the output to the second inverter 354; a second transmission gate 356, which transmits the output of the first latching unit 353 to a fourth inverter 357 in response to the operation-determining signal OPDS and the first inverter 351 output; and the fourth inverter 357, which inverts the output of the second transmission gate 356 and generates the first operation control signal OPCON1.

The second operation-controlling part 360 is illustrated as identical to operation-controlling part 350, but receives companion pulse signal COMP2 and operation-determining signal OPDS, and generates second operation control signal OPCON2.

Figure 4:
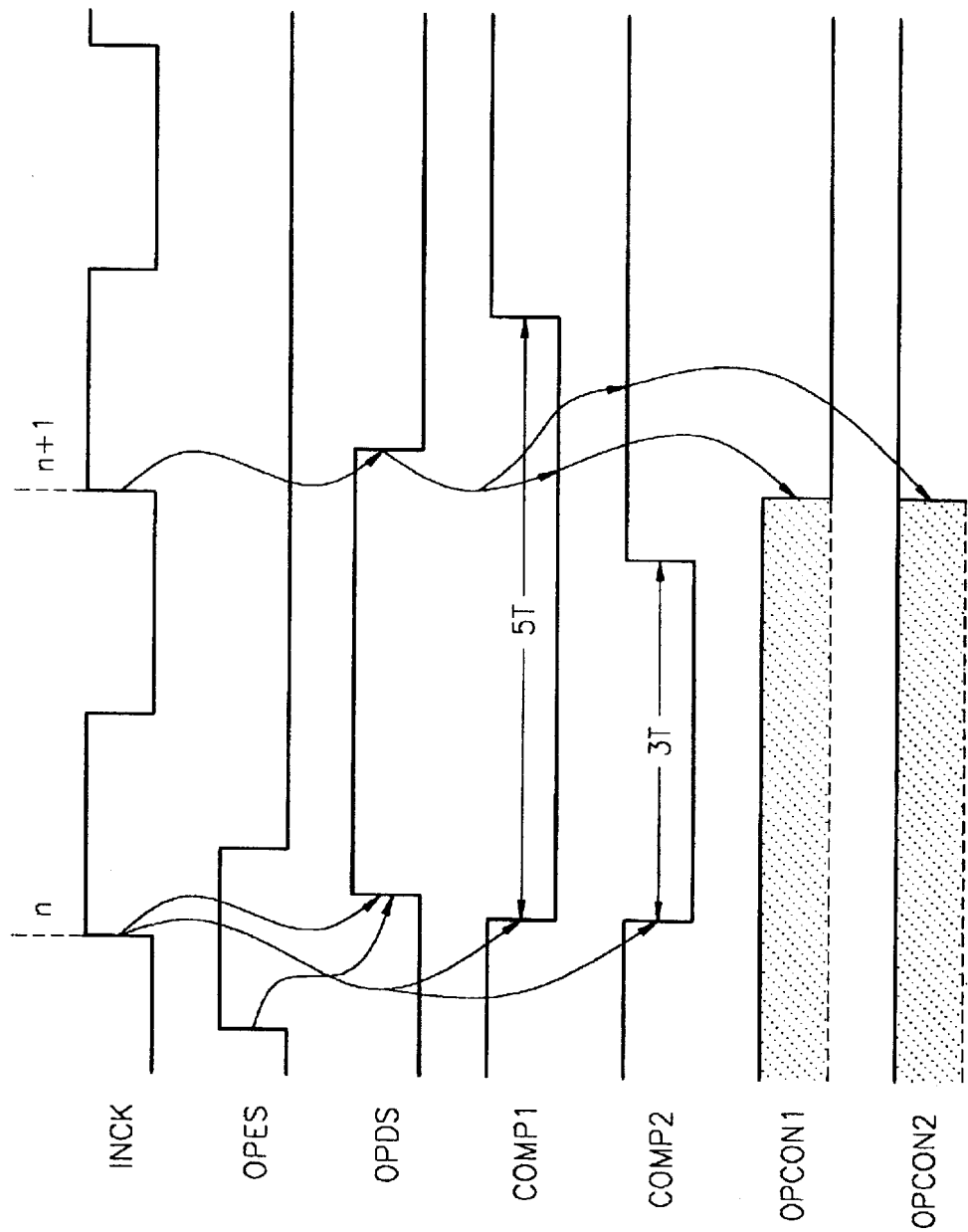
FIG. 4 is a timing diagram illustrating the operation of the circuit for recognizing a cycle of a reference clock signal shown in FIG. 3.

FIG. 4 is a timing diagram illustrating the operation of circuit 300. In order to operate the circuit 300 for recognizing a cycle of a reference clock signal, the operation-enabling signal OPES is first applied at a high level. If an n-th clock pulse of the input signal INCK is enabled at a high level, the operation-determining signal OPDS is enabled at a high level in response to the input signal INCK and the operation enabling signal OPES.

The input signal INCK applied to the delay-time-defining portion 320 passes through all of the delay devices 321, 323, 325, 327, and 329, thereby generating the first delay signal DES1. The first delay signal DES1 is applied to the first comparing means 331 of the comparing portion 330. The input signal INCK passes through only three delay devices 321, 323, and 325 to generate the second delay signal DES2. The second delay signal DES2 is applied to the second comparing means 333 of the comparing portion 330.

The first comparing means 331 receives the first delay signal DES1 and the input signal INCK, and generates the first comparison pulse signal COMP1. The second comparing means 333 receives the second delay signal DES2 and the input signals INCK, and generates the second comparison pulse signal COMP2. The configurations of the delay time defining portion 320 and the comparing portion 330 are the same as that of an auto pulse generator. Thus, the first and second comparison pulse signals COMP1 and COMP2 have a pulse shape. If the delay time of the delay-time-defining portion 320 delay devices 321, 323, 325, 327, and 329 is "T", respectively, the first comparison pulse signal COMP1 has a delay time of 5T, and the second comparison pulse signal COMP2 has a delay time of 3T. This is clearly shown in FIG. 4.

When the (n+1)-th clock pulse of the input signal INCK is input to the operation-determining portion 301, the operation-determining signal OPDS transitions to a low level. The controlling portion 340 compares the operation-determining signal OPDS with the first and second comparison pulse signals COMP1 and COMP2 when the operation-determining signal OPDS returns to a low level, and generates the first and second operation control signals OPCON1 and OPCON2. The first and second operation control signals OPCON1 and OPCON2 have information related to whether the operation-determining signal OPDS is longer or shorter than a predetermined delay times generated by the delay-time-defining portion 320.

Here, the operation-determining signal OPDS is enabled at the rising edge of the input signal INCK clock pulse n, and is disabled from the next rising edge of the input signal INCK at clock pulse n+1, and thus has an active section of one cycle of the input signal INCK. Thus, the first and second operation control signals OPCON1 and OPCON2 have information related to whether a cycle of the input signal INCK is longer or shorter than a predetermined time.

The operation of the controlling portion 340 will now be described in greater detail. When the operation-determining signal OPDS is applied to the first inverter 351 of the first operation-controlling part 350 at a high level, the first transmission gate 352 is turned on, and the first comparison pulse signal COMP1 is applied to and latched in the first latching unit 353. An NMOS transistor MN1, whose on or off state is controlled by a reset signal RESET, initializes the first latching unit 353 prior to OPDS assertion.

When the operation-determining signal OPDS returns to a low level and is applied to the first inverter 351, the first transmission gate 352 is turned off, and the second transmission gate 356 is turned on. Then, the first comparison pulse signal COMP1 is output from the first latching unit 353 and is generated as the first operation control signal OPCON1 through the fourth inverter 357. Referring to FIG. 4, the first comparison pulse signal COMP1 is in a low-level state when the operation-determining signal OPDS returns to a low level, and thus the first operation control signal OPCON1 is also generated at a low level. That is, in a case where the operation-determining signal OPDS is shorter than the first comparison pulse signal COMP1, the first operation control signal OPCON1 is generated at a low level.

The operation of the second operation-controlling part 360 is the same as that of the first operation-controlling part 350, and thus a detailed description thereof will be omitted. Referring to FIG. 4, the second comparison pulse signal COMP2 is in a high-level state when the operation-determining signal OPDS is at a low level, and thus the second operation control signal OPCON2 is also generated at a high level. That is, in a case where the operation-determining signal OPDS is longer that the second comparison pulse signal COMP2, the second operation control signal OPCON2 is generated at a high level.

Thus, it can be known whether the cycle of the input signal INCK is longer or shorter than a predetermined time, depending on the logic level of the first or second operation control signal OPCON1 or OPCON2, and the result may be used to control the operation of the semiconductor memory device.

Figure 5:
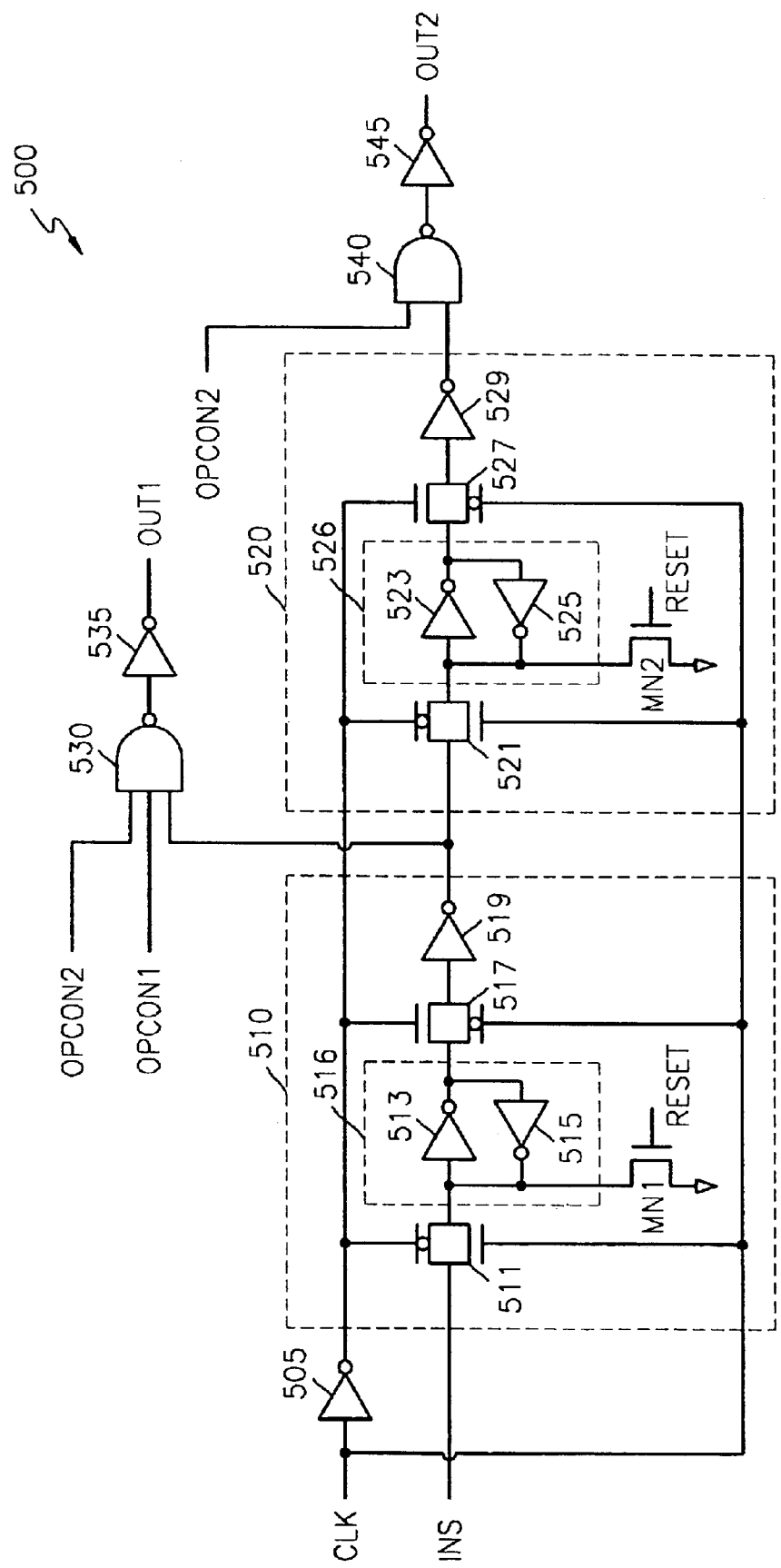
FIG. 5 is a circuit diagram illustrating a circuit using the circuit for recognizing a cycle of a reference clock signal shown in FIG. 3.

FIG. 5 is a circuit diagram illustrating a circuit 500 that uses OPCON1 and OPCON2 to control device operation. The circuit 500 shown in FIG. 5 includes: an inverter 505, for inverting a clock signal CLK; transmission gates 511, 517, 521, and 527, whose on or off state is controlled in response to the output of the inverter 505; inverters 513, 515, 523, and 525 for forming latches; inverters 519 and 529, for inverting outputs of the transmission gates 517 and 527; a NAND gate 530, which receives the first and second operation control signals OPCON1 and OPCON2 and the output of the inverter 519, and compares the first and second operation control signals OPCON1 and OPCON2 with the output of the inverter 519; an inverter 535, which inverts the output of the NAND gate 530 and generates the output as a first output signal OUT1; a NAND gate 540, which compares the second operation control signal OPCON2 with the output of the inverter 529; and an inverter 545, which inverts the output of the NAND gate 540 and generates the output as a second output signal OUT2.

Figure 6:
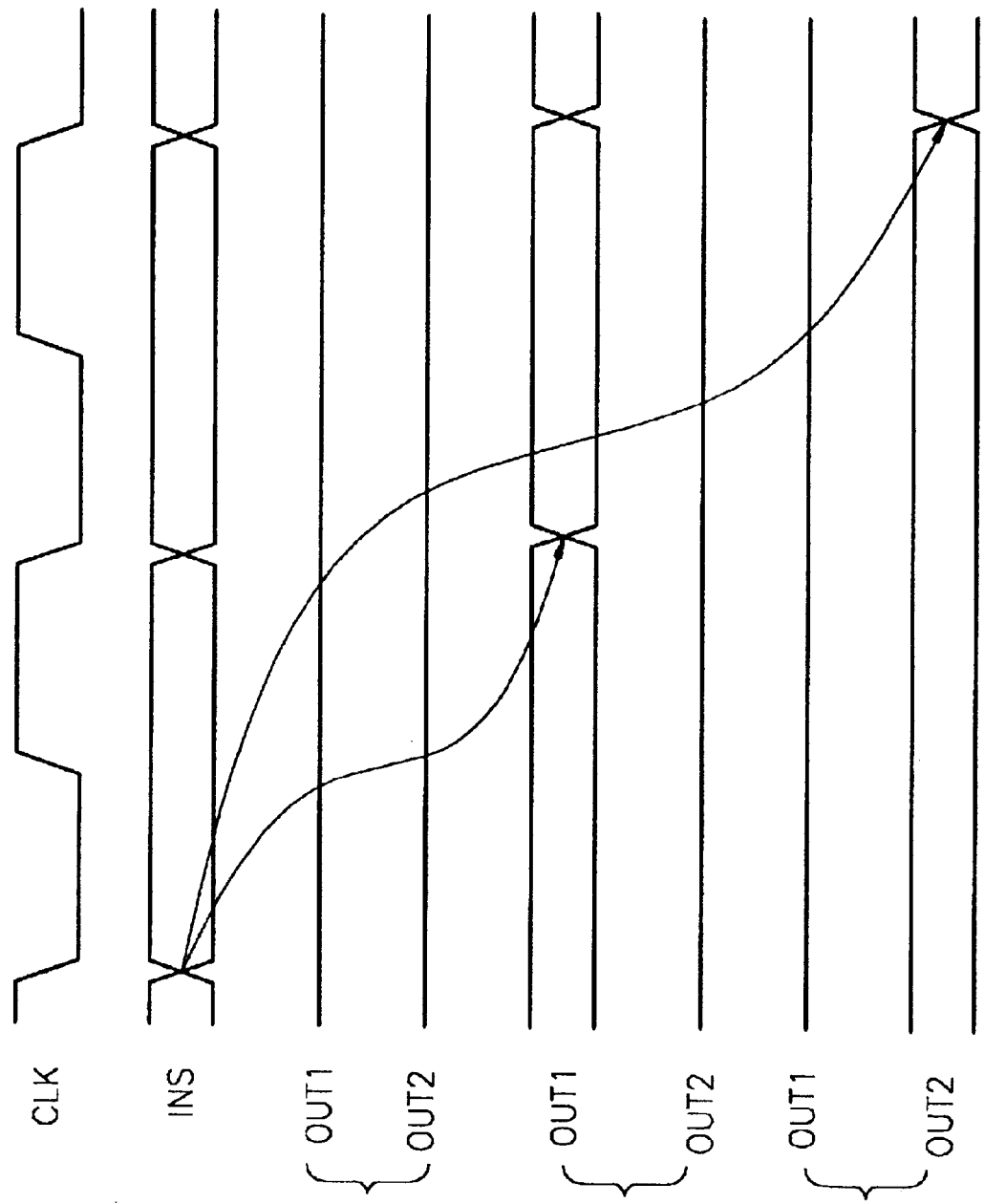
FIG. 6 is a timing diagram illustrating the operation of the circuit shown in FIG. 5.

FIG. 6 is a timing diagram illustrating the operation of the circuit shown in FIG. 5. Specifically, FIG. 6A illustrates that an input control signal INS is not generated as the first output signal OUT1 or the second output signal OUT2 in a case where both the first and second operation control signals OPCON1 and OPCON2 are at a low level.

FIG. 6B illustrates that the input control signal INS is generated as the first output signal OUT1 in a case where both the first and second operation control signals OPCON1 and OPCON2 are at a high level.

FIG. 6C illustrates that the input control signal INS is generated as the second output signal OUT2 in a case where the first operation control signal OPCON1 is at a low level and the second operation control signal OPCON2 is at a high level.

Hereinafter, the operation of the circuit 500 will be described with reference to FIGS. 5 and 6.

The circuit 500 of FIG. 5 operates in response to a clock signal CLK. Here, the clock signal CLK may be an internal clock signal or a reference clock signal.

The input control signal INS applied to the transmission gate 511 is a signal generated in the semiconductor memory device and controls a predetermined operation of the semiconductor memory device.

The circuit 500 of FIG. 5 controls the predetermined operation of the semiconductor memory device by generating the input control signal INS as the first output signal OUT1 or the second output signal OUT2 depending on the logic level of the first and second operation control signals OPCON1 and OPCON2, that is, depending on whether the input signal INCK cycles are longer or shorter than a predetermined delay time. In other words, the predetermined operation of the semiconductor memory device can be controlled according to the length of one cycle of the reference clock signal.

When the clock signal CLK is at a high level and applied to the inverter 505, the transmission gate 511 is turned on, and the input control signal INS is applied to a latch 516, which is comprised of the inverters 513 and 515. Here, an NMOS transistor MN1 receives the reset signal RESET and initializes the latch 516. When the clock signal CLK is at a low level and applied to the inverter 505, the transmission gate 517 is turned on, and thus the latched input control signal INS is applied to the NAND gate 530 through the inverter 519. In such a case, it is determined whether the input control signal INS applied to the NAND gate 530 is output as the first output signal OUT1 or not, depending on the logic levels of the first and second operation control signals OPCON1 and OPCON2.

If any one of the first and second operation control signals OPCON1 and OPCON2 is at a low level, the input control signal INS cannot be output. In a case where both the first and second operation control signals OPCON1 and OPCON2 are at a high level, the input control signal INS is generated as the first output signal OUT1. This is clearly shown in FIG. 6B.

At the next positive pulse edge of the clock signal CLK, transmission gate 521 is turned on, and the input control signal INS from the prior CLK positive pulse edge is applied to a latch 526, which is comprised of the inverters 523 and 525, from the inverter 519. Here, an NMOS transistor MN2 receives the reset signal RESET and initializes the latch 526. When the clock signal CLK subsequently transitions back to a low level, the transmission gate 527 is turned on. Thus the latched input control signal INS, from two positive CLK edges prior is applied to the NAND gate 540 through the inverter 529.

In such a case, it is determined whether or not the input control signal INS applied to the NAND gate 540 is output as the second output signal OUT2 or not, depending on the logic level of the second operation control signal OPCON2.

In a case where the first operation control signal OPCON1 is at a low level and the second operation control signal OPCON2 is at a high level, the input control signal INS is generated as the second output signal OUT2. This is clearly shown in FIG. 6C. In other cases, the input control signal INS cannot be generated as the second output signal OUT2.

That is, in a case where both the first and second operation control signals OPCON1 and OPCON2 are at a low level, the input control signal INS cannot be output to the outside. In a case where the first operation control signal OPCON1 is at a low level and the second operation control signal OPCON2 is at a high level, the input control signal INS is output to the outside after two cycles of the clock signal CLK passes. In a case where both the first and second operation control signals OPCON1 and OPCON2 are at a high level, the input control signal INS is output to the outside after only one cycle of the clock signal CLK has passed.

In connection with the circuit 300 for recognizing a cycle of a reference clock signal shown in FIG. 3, the first operation control signal OPCON1 is generated at a low level in a case where one cycle of the input signal INCK is shorter than the first comparison pulse signal COMP1, and the second operation control signal OPCON2 is generated at a high level in a case where one cycle of the input signal INCK is longer than the second comparison pulse signal COMP2. Thus, if the input signal RNCK, that is, one cycle of the reference clock signal, is greater than a first predetermined time (an enabling time of the second comparison pulse signal COMP2) and is less than a second predetermined time (an enabling time of the first comparison pulse signal COMP1), the input control signal INS is output to the outside after two cycles of the clock signal CLK passes.

In the case of applying this to the circuit 500 of FIG. 5, the input control signal INS is not output to the outside when one cycle of the reference clock signal is less than the first predetermined time, the input control signal INS is output to the outside after only one cycle of the clock signal CLK passes when the cycle of the reference clock signal is greater than the second predetermined time, and the input control signal INS is output to the outside after two cycles of the clock signal CLK pass when the cycle of the reference clock signal is between the first predetermined time and the second predetermined time.

Figure 7:
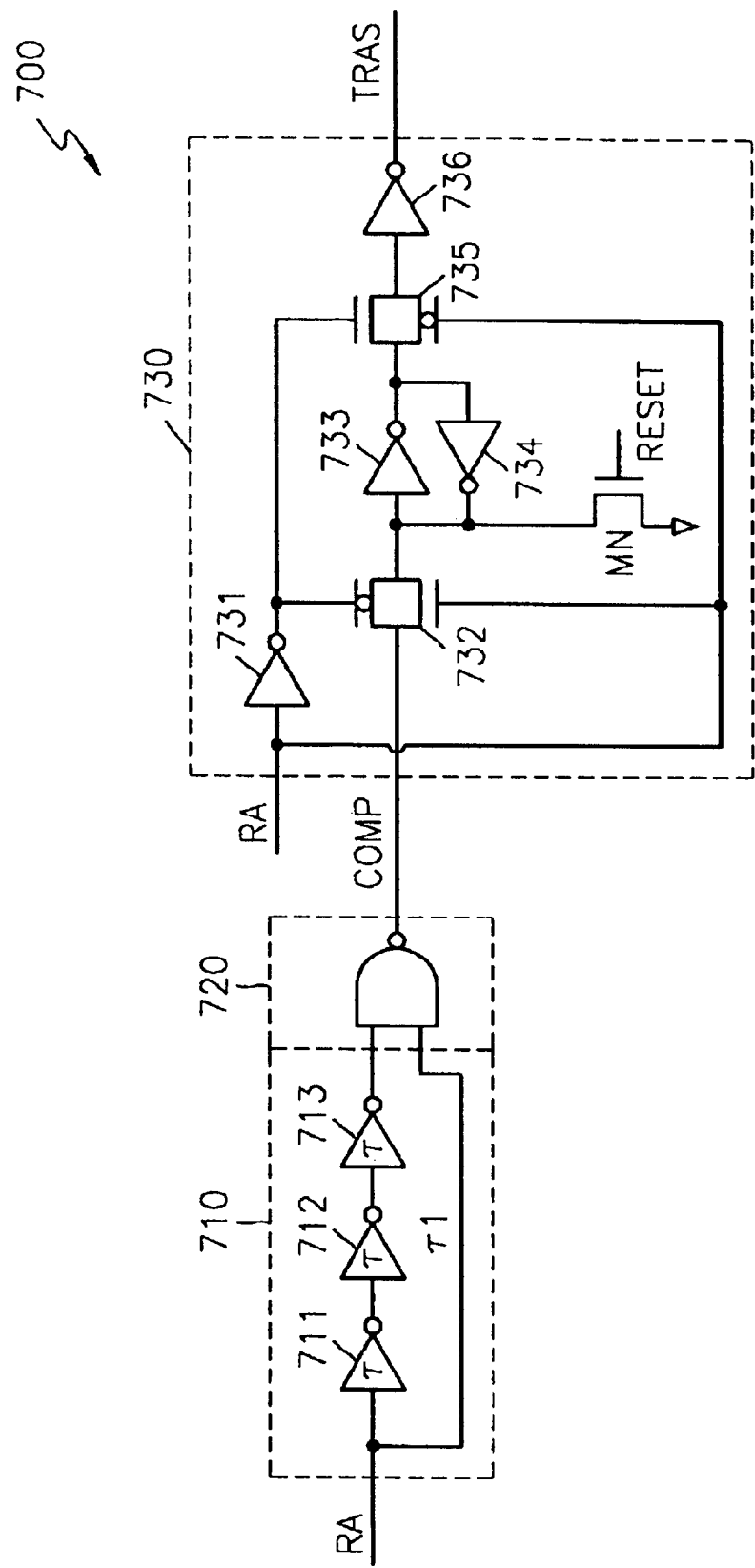
FIG. 7 is a circuit diagram of a circuit for detecting a RAS time using the AC-timing parameter control circuit shown in FIG. 1.

FIG. 7 is a circuit diagram of a circuit for detecting a RAS time using the circuit for controlling an AC timing parameter of a semiconductor memory device shown in FIG. 1.

Referring to FIG. 7, the circuit 700 for detecting a RAS time has a configuration similar to the circuit 300 for recognizing a cycle of a reference clock signal shown in FIG. 3. That is, the circuit 700 includes: a delay-time-defining portion 710, which receives a row active command RA; a comparing portion 720, which receives the output of the delay-time-defining portion 710 and the row active command RA and compares the two to generate a comparison signal COMP; and a controlling portion 730, which compares the row active command RA with the comparison signal COMP and generates an operation control signal TRAS.

The delay time defining portion 710 includes delay devices 711, 712, and 713. The comparing portion 720 is comprised of a NAND gate. And the controlling portion 730 has a configuration similar to the first or second controlling portion 350 or 360 of FIG. 3.

In view of the operation of the circuit 700, a RAS time means the time required for a precharge command to be enabled after the row active command RA is enabled. If the precharge command is enabled after the row active command RA is enabled, the row active command RA is disabled, and thus RAS time is the time required from when the row active command RA is enabled to when it is again disabled.

The operation of the circuit 700 for detecting a RAS time shown in FIG. 7 is similar to that of the circuit 300 for recognizing a cycle of a reference clock signal shown in FIG. 3. That is, if the row active command RA is applied to the delay-time-defining portion 710, the delay-time-defining portion 710 delays the row active command RA for a predetermined time and applies the row active command RA to the comparing portion 720. The comparing portion 720 compares the output of the delay-time-defining portion 710 with the row active command RA and generates a comparison pulse signal COMP having a predetermined active section. The controlling portion 730 receives the comparison pulse signal COMP and the row active command RA, compares whether the row active command RA is longer or shorter than the comparison pulse signal COMP when the row active command RA transitions low, and thus generates the operation control signal TRAS. Thus, the operation control signal TRAS has information related to whether the row active command RA is longer or shorter than the comparison pulse signal COMP.

RAS time, as described above, means the time required for the row active command RA to be enabled and then disabled. In the embodiment of FIG. 7, it is assumed that the RAS time recognizes whether the row active command RA is longer or shorter than the comparison pulse signal COMP every RC time. Here, RC time means the time required for the row active command RA is to be re-enabled after the row active command RA is enabled and disabled. Thus, as with the circuit 300 for recognizing a cycle of a reference clock signal shown in FIG. 3, there is no need to include a separate circuit for generating an operation-determining signal OPDS so as to select a time for recognizing a cycle of a reference clock signal.

Figure 8:
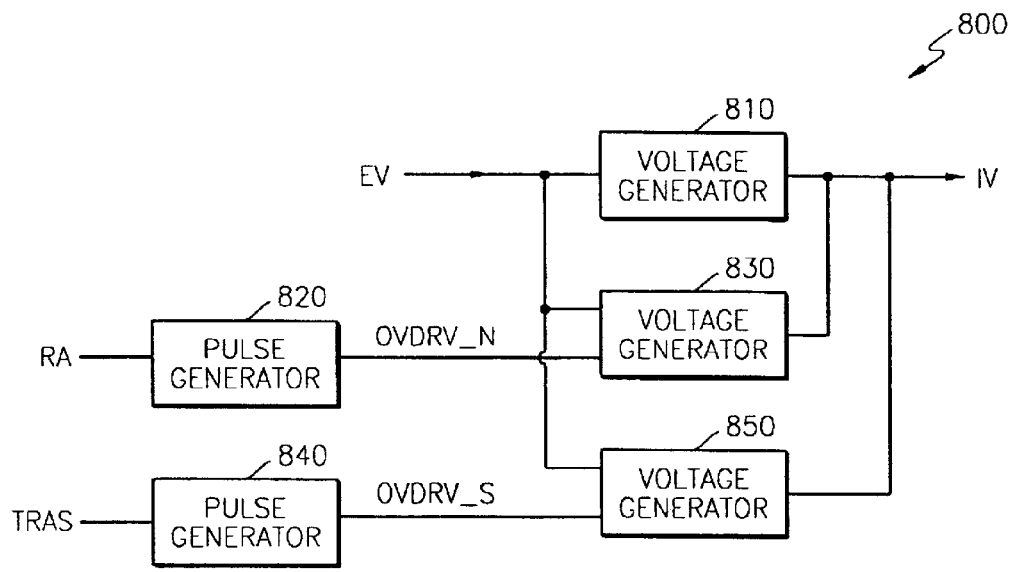
FIG. 8 is a block diagram of an internal voltage generator using a signal for controlling the operation of the circuit shown in FIG. 7.

FIG. 8 is a block diagram of an internal voltage generator using a signal for controlling the operation of the circuit shown in FIG. 7. A conventional internal voltage generator 800 includes: a voltage generator 810, which receives an external voltage EV and generates an internal voltage IV; a pulse generator 820, which generates a pulse signal in response to a row active (RA) command; and a voltage generator 830, which generates a predetermined voltage in response to the external voltage EV and output OVDRV_N of the pulse generator 820. The internal voltage generator 800 of FIG. 8 additionally includes a pulse generator 840, which generates a pulse signal in response to an operation control signal TRAS generated in circuit 700 of FIG. 7, and a voltage generator 850, which generates a predetermined voltage in response to output OVDRV_S of the pulse generator 840 and the external voltage EV.

Figure 9:
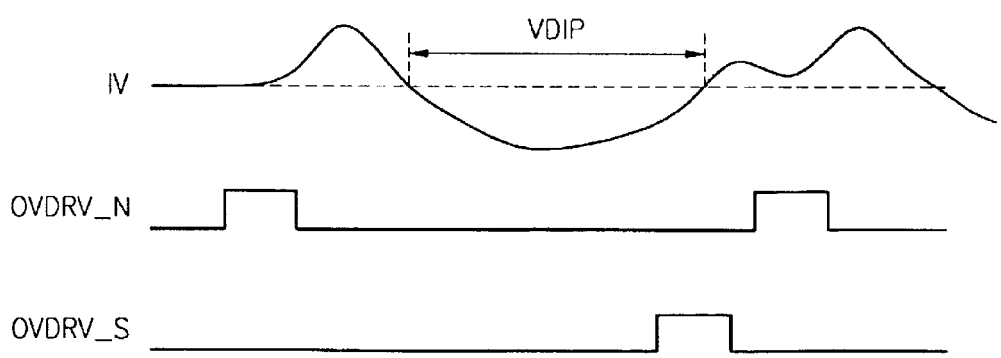
FIG. 9 is a timing diagram illustrating the operation of the internal voltage generator shown in FIG. 8.

FIG. 9 illustrates the operation of the internal voltage generator shown in FIG. 8.

Consumption of power in a memory array is increased when the row active command RA is enabled in the semiconductor memory device, and thus the level of the internal voltage IV drops considerably. This internal voltage drop is shown as a time segment marked VDIP in FIG. 9. Thus, most semiconductor memory devices include a circuit that compensates for voltage drop of the internal voltage IV.

As an example of a compensation circuit, there is a circuit for generating a short pulse signal OVDRV_N when the row active command RA is enabled, and then generating additional power in response to the short pulse signal OVDRV_N, thereby instantly increasing the driving capability of the voltage generator 810. With this method, however, due to problems such as overshooting, the driving capability of the voltage generator 810 cannot be infinitely increased.

Some of the voltage drop is compensated for by a circuit that generates a pulse signal in response to the row active command RA and then generates a predetermined voltage. The remaining drop in voltage is compensated for by the normal operation of the voltage generator 810 for a RAS time. If the RAS time is sufficient, compensating for the voltage drop by using the pulse generator 820 and the voltage generator 830, which are operated by the row active command RA, may operate effectively. But if the RAS time is decreased, the voltage generator 810 may not operate effectively, and thus it becomes difficult to compensate for the drop in the internal voltage IV.

In order to solve the problem, the pulse generator 840 and the voltage generator 850, which operate in response to the operation control signal TRAS output from circuit 700 are added to the internal voltage generator 800. In other words, if the RAS time is shorter than a preset time, then the operation control signal TRAS is generated at a predetermined logic level, the pulse generator 840 generates the pulse signal OVDRV_S in response to the operation control signal TRAS at the predetermined logic level, and the driving capability of the voltage generator 810 is increased by the voltage generator 850, which receives the pulse signal OVDRV_S.

The internal voltage generator 800 shown in FIG. 8 generates a short pulse signal OVDRV_N in response to the row active command RA when the RAS time is long (for example, in this case, when the operation control signal TRAS is at a low level), and increases the driving capability of the voltage generator 810 by a voltage that is generated in the voltage generator 830. When the RAS time is short (for example, in this case, when the operation control signal TRAS is at a high level), the pulse generator 840 generates the short pulse signal OVDRV_S by receiving the operation control signal TRAS having a high level from circuit 700. Voltage generator 850 responds to OVDRV.S by further increasing the driving capability of the voltage generator 810. The pulse signal OVDRV_N, which is generated when the pulse generator 820 responds to the row active command RA, and the pulse signal, OVDRV_S which is generated when the pulse generator 840 responds to the operation control signal TRAS, are shown in FIG. 9. In FIG. 9, the level of the internal voltage IV improves when the pulse signal is generated.

Figure 10:
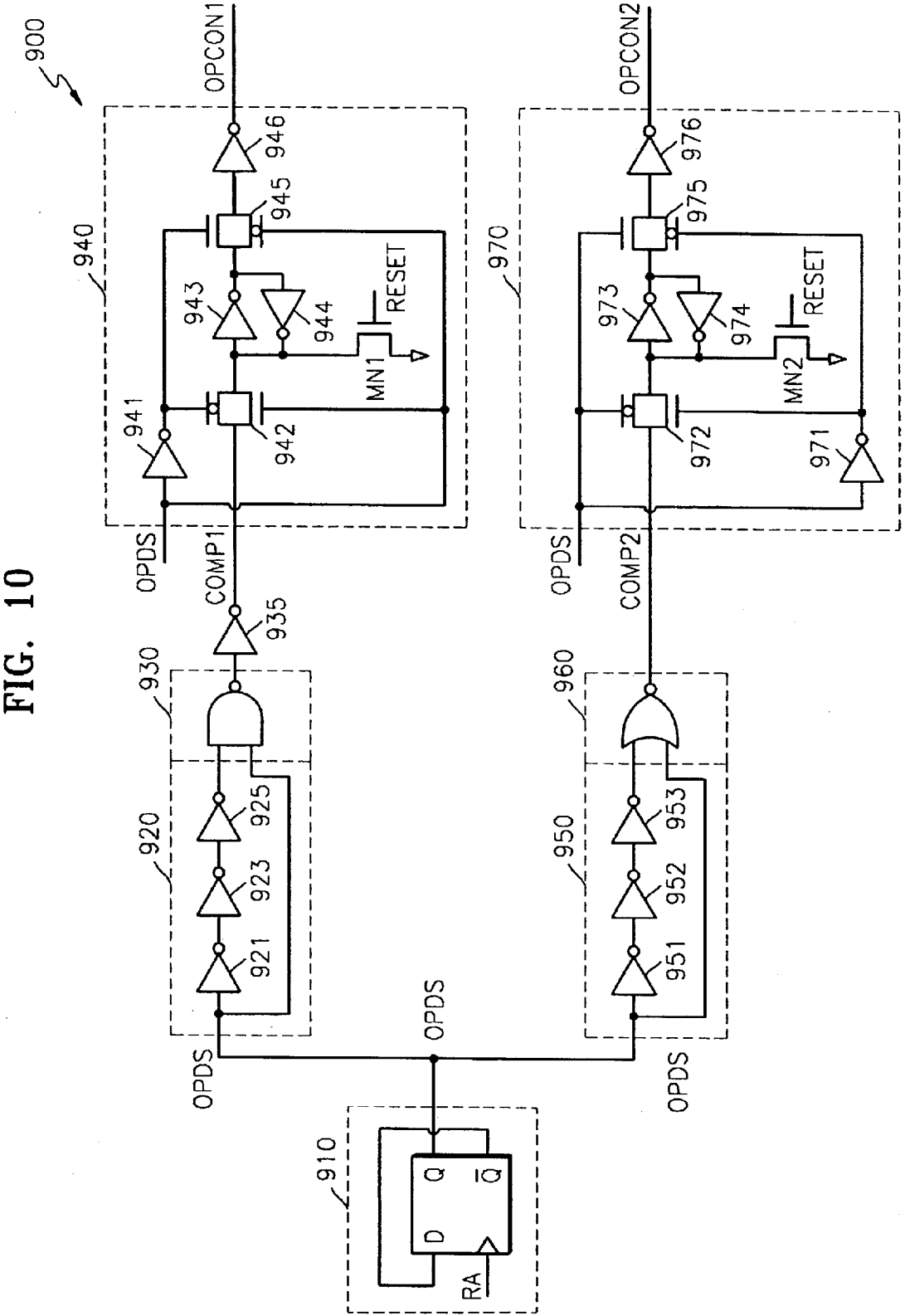
FIG. 10 is a circuit diagram of a circuit for detecting a RC time using the AC-timing parameter control circuit shown in FIG. 1.

FIG. 10 is a circuit diagram of a circuit for detecting a RC time using the circuit for AC-timing-parameter control circuit shown in FIG. 1.

Figure 11:
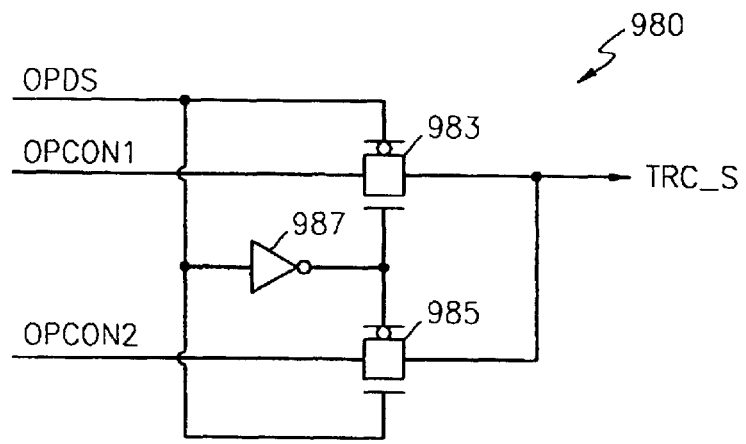
FIG. 11 illustrates a circuit for generating a control signal having information related to an RC time.

FIG. 11 illustrates a circuit for generating a control signal having information related to a RC time.

Figure 12:
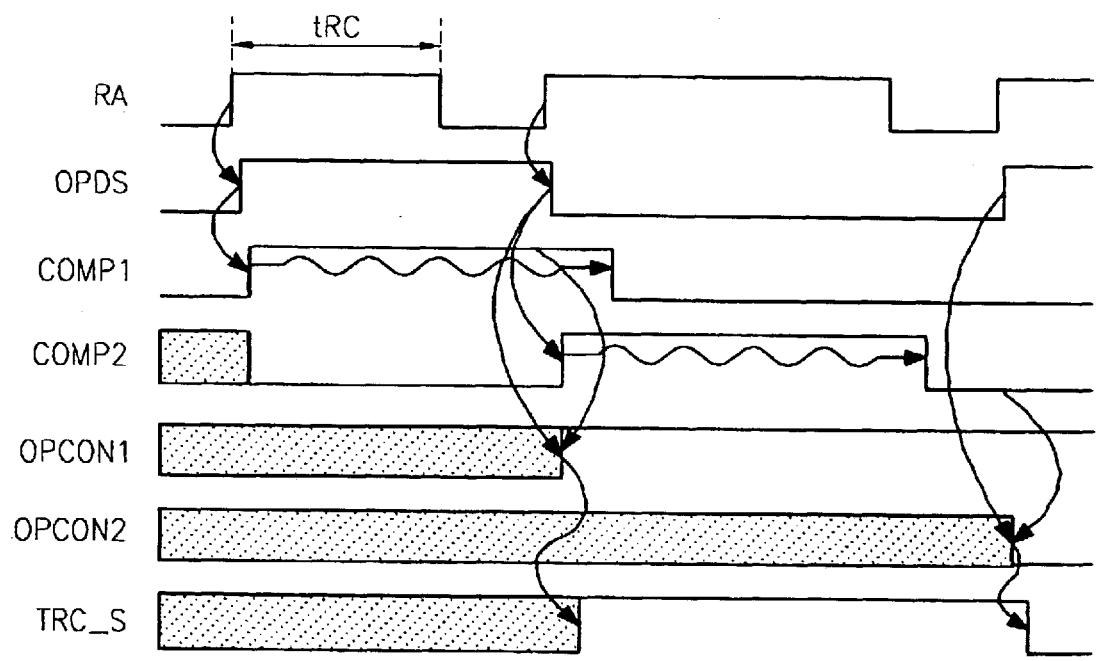
FIG. 12 is a timing diagram illustrating the operation of the circuits shown in FIGS. 10 and 11.

FIG. 12 is a timing diagram illustrating the operation of the circuits shown in FIGS. 10 and 11.

The circuit 900 for detecting a RC time shown in FIG. 10 is different from the circuit 300 for recognizing a cycle of a reference clock signal shown in FIG. 3 in that, e.g., a toggle flip-flop 910 generates an operation-determining signal OPDS, which is inverted at every rising edge of the row active command RA, and a NOR gate instead of a NAND gate is used in one of two comparing portions.

The operation of the circuit 900 for detecting a RC time will be described with reference to FIGS. 10, 11, and 12.

The RC time tRC means the time required for the row active command RA to be enabled again after the row active command RA is enabled and disabled.

The circuit 900 for detecting a RC time shown in FIG. 10 includes two delay-time-defining portions 920 and 950, two comparing portions 930 and 960, and two controlling portions 940 and 970, so as to detect the RC time tRC at every rising edge of the row active command RA.

In order to detect the RC time tRC at every rising edge of the row active command RA, the toggle flip-flop 910 generates an operation-determining signal OPDS signal, that is inverted at every rising edge of the row active command RA.

The operation-determining signal OPDS is applied to the delay-time-determining portion 920 at a rising edge of the operation-determining signal OPDS, and a first comparison pulse signal COMP1 is generated in the comparing portion 930 to have a predetermined active width. Controlling portion 940 generates a first operation control signal OPCON1, which is latched by comparing the first comparison pulse signal COMP1 with the operation-determining signal OPDS at the next falling edge of the operation-determining signal OPDS. Referring to FIG. 12, the active section of the operation-determining signal OPDS is shorter than that of the first comparison pulse signal COMP1, and in such a case, the first operation control signal OPCON1 is generated at a high level.

The operation-determining signal OPDS is applied to the delay-time-defining portion 950 at a falling edge of the operation-determining signal OPDS, and a second comparison pulse signal COMP2 is generated in the comparing portion 960 to have a predetermined active section. A signal, which is latched by comparing the second comparison pulse signal COMP2 with the operation-determining signal OPDS at the next rising edge of the operation-determining signal OPDS, is generated in the controlling portion 940 as a second operation control signal OPCON2. Referring to FIG. 12, the second comparison pulse signal COMP2 is at a low level at the rising edge of the operation-determining signal OPDS, and in such a case, the second operation control signal OPCON2 is generated at a low level.

Likewise, the RC time tRC is recognized at every rising edge of the row active command RA, that is, at every rising edge and falling edge of the operation-determining signal OPDS, and thus, the circuit 900 for detecting a RC time shown in FIG. 10 can recognize the consecutive RC time tRC.

The circuit 980 shown in FIG. 11 alternately outputs the first operation control signal OPCON1 and the second operation control signal OPCON2 at every rising edge and falling edge of the operation-determining signal OPDS. That is, the first operation control signal OPCON1 is output as a control signal TRC_S at the falling edge of the operation-determining signal OPDS, and the second operation control signal OPCON2 is output as the control signal TRC_S at the rising edge of the operation-determining signal OPDS.

The control signal TRC_S has information related to the RC time tRC in the previous step at every rising edge of the row active command RA, that is, information related to whether the RC time tRC is longer or shorter than a preset predetermined time, is generated by the operation.

The control signal TRC_S may be used in an application circuit for controlling an internal operation of a semiconductor memory device.

As described above, an AC-timing-parameter control circuit for a semiconductor memory device, and operating method thereof according to the present invention, can recognize a variation in an AC timing parameter of the semiconductor memory device and can control the operation of the semiconductor memory device suitable for the AC-timing parameter.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A circuit for controlling an AC-timing parameter of a semiconductor memory device by recognizing a variation in the AC-timing parameter and controlling the operation of the semiconductor memory device, the circuit comprising:

a delay-time-defining portion to receive an input signal and generate first through n-th (wherein n is a natural number) delay signals, each delay signal offset from the input signal by a corresponding delay time;

a comparing portion to receive the input signal and the first through n-th delay signals and generate first through n-th comparison pulse signals, respectively representing a comparison of the input signal to a respective one of the delay signals, each pulse signal having an active section with a corresponding duration; and a controlling portion to receive the input signal and the first through n-th comparison pulse signals, compare the input signal with the first through n-th comparison pulse signals, and generate first through n-th operation control signals for controlling an AC-timing parameter of the semiconductor memory device.

2. The circuit of claim 1, wherein the input signal is a semiconductor memory device clock signal or consecutive commands.

3. The circuit of claim 1, wherein the delay-time-defining portion comprises:

a first delay device to generate the first delay signal by receiving the input signal and delaying the input signal by a first delay time;

a second delay device to generate the second delay signal by receiving the first delay signal and delaying the first delay signal by a second an n-th delay time; and an n-th delay device for generating the n-th delay signal by receiving an (n−1)-th delay signal and by delaying the (n−1)-th delay signal by a predetermined delay time.

4. The circuit of claim 3, wherein the delay devices have different delay times.

5. The circuit of claim 1, wherein the comparing portion includes first through n-th comparing means that each receive the input signal and that each receive a corresponding one of the first through n-th delay signals, and generate a corresponding one of the first through n-th comparison pulse signals.

6. The circuit of claim 5, wherein the first through n-th comparison pulse signals have different active sections durations.

7. The circuit of claim 1, wherein the controlling portion includes first through n-th operation-controlling parts, that each receive the input signal and a corresponding one of the first through n-th comparison pulse signals, compare an active section of the input signal with the active section time of the corresponding one of the first through n-th comparison pulse signals, and generate a corresponding one of the first operation control signals.

8. The circuit of claim 1, wherein the first through n-th operation control signals represent by their individual logic levels whether the active sections of the input signal are longer or shorter than those of the first through n-th comparison pulse signals.

9. The circuit of claim 1, further comprising an operation-determining portion, which receives the input signal and an operation-enabling signal, and determines whether or riot operation-input signal that controls the enabling or disabling of the circuit is transferred to the delay-time-defining portion.

10. The circuit of claim 9, wherein the operation-enabling signal is generated by a mode register set (MRS).

11. The circuit of claim 9, wherein the operation-determining portion is a NAND gate having the input signal and the operation-enabling signal as inputs.

12. A method for controlling an AC-timing parameter of a semiconductor memory device by recognizing a variation in the AC timing parameter of the semiconductor memory device and controlling the operation of the semiconductor memory device, the method comprising:

(a) receiving an input signal and generating first through n-th (wherein n is a natural number) delay signals, each delay signal offset from the input signal by a corresponding delay time;

(b) using the input signal and the first through n-th delay signals to generate first through n-th comparison pulse signals, each pulse signal having an active section with a corresponding to one of the delay time durations; and (c) comparing the input signal with the first through n-th comparison pulse signals and generating first through n-th operation control signals for controlling an AC-timing parameter of the semiconductor memory device.

13. The method of claim 12, wherein the input signal is a semiconductor memory device clock signal or consecutive commands.

14. The method of claim 12, wherein the input signal is applied in response to an operation-enabling signal.

15. The method of claim 14, wherein the operation-enabling signal is generated by a mode register set (MRS).

16. The method of claim 12, wherein n is at least three and step (a) comprises:

(a1) generating the first delay signal by delaying the input signal by a first delay time;

(a2) generating the second delay signal by delaying the first delay signal by a second delay time; and (a3) generating the n-th delay signal by delaying an (n−1)-th delay signal by an n-th delay time.

17. The method of claim 16, wherein the first through n-th delay signals have different delay times.

18. The method of claim 12, wherein the first through n-th comparison pulse signals have different durations of active sections.

19. The method of claim 12, wherein the first through n-th operation control signals represent by their individual logic levels whether the active sections of the input signal are longer or shorter than those of the first through n-th comparison pulse signals.

20. A circuit for recognizing a cycle of a reference clock signal by recognizing a variation in an AC-timing parameter of a semiconductor memory device and for controlling the operation of the semiconductor memory device, the circuit comprising:

an operation-determining portion to receive an input signal and an operation-enabling signal and generate an operation-determining signal;

a delay-time-defining portion to receive the input signal and generate first and second delay signals, delayed from the input signal by a corresponding delay time;

a comparing portion to receive the first and second delay signals and generate first and second comparison pulse signals, each having an active section with a duration corresponding to the delay time of corresponding delay signal; and a controlling portion, to receive the operation-determining signal and the first and second comparison pulse signals, compare the operation-determining signal with the first and second comparison pulse signals, and generates the first and second operation control signals based on the comparison of the operation-determining signal with the comparison pulse signals, for controlling the semiconductor memory device.

21. The circuit of claim 20, wherein the input signal is a reference clock signal.

22. The circuit of claim 20, wherein the operation-determining portion is a flip-flop, which receives the operation-enabling signal at an input terminal, receives the input signal at a clock input terminal, and outputs the operation-determining signal at an output terminal.

23. The circuit of claim 20, wherein the delay-time-defining portion includes an odd number of delay devices, having corresponding delay times and connected in series.

24. The circuit of claim 23, wherein the input signal passes through all serially-connected delay devices, thereby generating the first delay signal with a first delay time, and the input signal passes through some odd number of the delay devices, thereby generating the second delay signal with a second delay time.

25. The circuit of claim 23, wherein the delay devices have different delay times.

26. The circuit of claim 20, wherein the comparing portion comprises:
 a first comparing means, which receives the input signal and the corresponding first delay signal and generates the first comparison pulse signal having an active section with a duration corresponding to the first delay time; and
 a second comparing means, which receives the input signal and the corresponding second delay signal and generates the second comparison pulse signal having an active section with a predetermined duration corresponding to the second delay time.

27. The circuit of claim 26, wherein the first and second comparing means are NAND gates.

28. The circuit of claim 26, wherein the first and second comparison pulse signals have different active section durations.

29. The circuit of claim 20, wherein the controlling portion comprises:
 a first operation-controlling part, which receives the operation-determining signal and the corresponding first comparison pulse signal, compares the duration of an active section of the operation-determining signal with the duration of an active section of the first comparison pulse signal, and generates the first operation control signal for controlling the semiconductor memory device; and
 a second operation-controlling part, which receives the operation-determining signal and the corresponding second comparison pulse signal, compares the duration of an active section of the operation-determining signal with the duration of an active section of the second comparison pulse signal and generates the second operation control signal for controlling the semiconductor memory device.

30. The circuit of claim 29, wherein the first and second operation control signals represent, based on their respective logic level, whether the active section of the operation-determining signal is longer or shorter than those of the first and second comparison pulse signals, respectively.

31. The circuit of claim 29, wherein the first operation-controlling part comprises:
 a first inverter, which receives and inverts the operation-determining signal;
 a first transmission gate, which transmits the first comparison pulse signal to a first latching unit in response to the operation-determining signal and an output signal of the first inverter;
 the first latching unit, which includes a second inverter for inverting the output of the first transmission gate and a third inverter for inverting the output of the second inverter and applying the output of the third inverter to the second inverter;
 a second transmission gate, which transmits the output of the first latching unit to a fourth inverter in response to the operation-determining signal and the output signal of the first inverter; and
 the fourth inverter, which inverts the output of the second transmission gate and generates the output as the first operation control signal.

32. The circuit of claim 29, wherein the second operation-controlling part comprises:
 a fifth inverter, which receives and inverts the operation-determining signal;
 a third transmission gate, which transmits the second comparison pulse signal to a second latching unit in response to the operation-determining signal and an output signal of the fifth inverter;
 the second latching unit, which includes a sixth inverter for inverting the output of the third transmission gate and a seventh inverter for inverting the output of the sixth inverter and applying the output of the seventh inverter to the sixth inverter;
 a fourth transmission gate, which transmits the output of the second latching unit to a predetermined eighth inverter in response to the operation-determining signal and the output signal of the fifth inverter; and
 the eighth inverter, which inverts the output of the fourth transmission gate and generates the output as the second operation control signal.

33. A method for operating a semiconductor device, the method comprising:
 comparing the duration of an input signal to the duration of a first internally generated comparison pulse;
 selecting a first internal operation when the input signal duration is less than the comparison pulse duration; and
 selecting a second internal operation when the input signal duration is greater than the comparison pulse duration.

34. The method of claim 33, wherein the input signal is a reference clock signal, the first and second internal operations comprising operation timing, wherein the first internal operation requires more reference clock periods to perform than the second internal operation requires.

35. The method of claim 33, wherein the input signal is a row address signal, the first internal operation comprising momentarily activating a first supplemental internal voltage generator in response to the application of a row address signal.

36. The method of claim 35, wherein both the first and second internal operations comprise momentarily activating a second supplemental internal voltage generator in response to the application of a row address signal.

37. The method of claim 33, further comprising:
 comparing the duration of the input signal to the duration of a second internally generated comparison pulse, the duration of the second comparison pulse shorter than the duration of the first comparison pulse;
 selecting the first internal operation when the input signal duration is greater than the second comparison pulse duration but less than the first comparison pulse duration; and
 selecting a third internal operation when the input signal duration is less than the second comparison pulse duration.

38. The method of claim 37, wherein the third internal operation comprises disabling an operation that would otherwise occur.

39. The method of claim 33, wherein the input signal is the time interval between two successive row address signal assertions, and wherein comparing the duration of the input signal comprises alternating the comparison function between two circuits, such that the first circuit compares the time between a first row address signal assertion and a second row address signal assertion, and the second circuit compares the time between the second row address signal assertion and a third row address signal assertion.

40. A semiconductor memory device having a control circuit to modify the behavior of the device, the control circuit comprising:

a first delay circuit to generate a first delayed signal in response to an input signal;

a first pulse generator to generate a first comparison pulse, the first comparison pulse having a duration related to the delay of the first delay circuit and triggered in response to an input signal assertion; and a first duration comparator to generate a first operation control signal, the operation control signal set to a first logic state when the duration of the input signal is longer than the duration of the first comparison pulse, the operation control signal set to a second logic state when the duration of the input signal is shorter than the duration of the first comparison pulse.

41. The memory device of claim 40, further comprising:

a second delay circuit to generate a second delayed signal in response to the input signal;

a second pulse generator to generate a second comparison pulse, the second comparison pulse having a duration related to the delay of the second delay circuit and triggered in response to an input signal assertion; and a second duration comparator to generate a second operation control signal, the second operation control signal set to a first logic state when the duration of the input signal is longer than the duration of the second comparison pulse, the second operation control signal set to a second logic state when the duration of the input signal is shorter than the duration of the second comparison pulse.

42. The memory device of claim 41, wherein the second delay circuit input is the first delay circuit output, such that the second comparison pulse duration is related to the delay of both the first and second delay circuits.

43. The memory device of claim 41, wherein the input signal is a reference clock signal, the memory device executing a selected internal operation in a first number of reference clock periods when the second operation control signal is set to the first logic state, the memory device executing the selected internal operation in a second, greater number of reference clock periods when the second operation control signal is set to the second logic state.

44. The memory device of claim 43, wherein the selected internal operation is disabled when the first operation control signal is set to the second logic state.

45. The memory device of claim 41, wherein the input signal is a command signal, and wherein the control circuit modifies the behavior of the device based on the time interval between successive command signals, the control circuit further comprising:

toggle circuitry to alternately cause comparison of the time interval to the first comparison pulse or the second comparison pulse; and select circuitry to select the first operation control signal as a control signal when the toggle circuitry causes a comparison of the time interval to the first comparison pulse, and to select the second operation control signal as the control signal when the toggle circuitry causes a comparison of the time interval to the second comparison pulse.

46. The memory device of claim 40, wherein the input signal is a command signal, and wherein the control circuit modifies the behavior of the device based on an active pulse width of a current command signal.

47. The memory device of claim 46, further comprising a primary voltage generator and a first supplemental voltage generator, the operation control signal momentarily activating the first supplemental voltage generator to aid the primary voltage generator when the operation control signal is set to the second logic state.

48. The memory device of claim 47, further comprising a second supplemented voltage generator, the second supplemental voltage generator momentarily activated to aid the primary voltage generator in response to the current command signal.

* * * * *

UNITED STATES PATENT AND TRADEMARK OFFICE
CERTIFICATE OF CORRECTION

PATENT NO. : 6,795,354 B2
DATED : September 21, 2004
INVENTOR(S) : Cho et al.

It is certified that error appears in the above-identified patent and that said Letters Patent is hereby corrected as shown below:

Column 15,
Line 2, "signal RNCK, that" should read -- signal INCK, that --.

Column 19,
Line 50, "whether or riot operation-input" should read -- whether or not operation-input --.

Column 20,
Lines 3-4, "section with a corresponding" should read -- section corresponding --.

Signed and Sealed this

Twenty-first Day of June, 2005

JON W. DUDAS
*Director of the United States Patent and Trademark Office*